(12) United States Patent
Deye et al.

(10) Patent No.: US 12,522,916 B2
(45) Date of Patent: Jan. 13, 2026

(54) SYSTEMS AND METHODS FOR PROCESSING A SILICON SURFACE USING MULTIPLE RADICAL SPECIES

(71) Applicant: ASM IP Holding, B.V., Almere (NL)

(72) Inventors: Gregory Deye, Phoenix, AZ (US); Caleb Miskin, Mesa, AZ (US); Hichem M'Saad, Paradise Valley, AZ (US); Steven Reiter, Phoenix, AZ (US); Alexandros Demos, Scottsdale, AZ (US); Fei Wang, Phoenix, AZ (US)

(73) Assignee: ASM IP Holding B.V., Almere (NL)

( * ) Notice: Subject to any disclaimer, the term of this patent is extended or adjusted under 35 U.S.C. 154(b) by 291 days.

(21) Appl. No.: 18/068,399

(22) Filed: Dec. 19, 2022

(65) Prior Publication Data

US 2023/0193475 A1 Jun. 22, 2023

Related U.S. Application Data

(60) Provisional application No. 63/292,697, filed on Dec. 22, 2021.

(51) Int. Cl.
| | |
|---|---|
| *C23C 16/02* | (2006.01) |
| *C09K 13/00* | (2006.01) |
| *C23C 16/24* | (2006.01) |
| *C23F 1/12* | (2006.01) |
| *H01J 37/32* | (2006.01) |
| *H01L 21/02* | (2006.01) |

(Continued)

(52) U.S. Cl.
CPC .......... *C23C 16/0245* (2013.01); *C09K 13/00* (2013.01); *C23C 16/24* (2013.01); *C23F 1/12* (2013.01); *H01J 37/32357* (2013.01); *H01L 21/02057* (2013.01); *H01L 21/02312* (2013.01); *H01L 21/02381* (2013.01); *H01L 21/02433* (2013.01); *H01L 21/02532* (2013.01); *H01L 21/02634* (2013.01); *H01L 21/02658* (2013.01); *H01L 21/3065* (2013.01); *H01L 21/67028* (2013.01); *H01J 2237/334* (2013.01); *H01J 2237/335* (2013.01)

(58) Field of Classification Search
None
See application file for complete search history.

(56) References Cited

U.S. PATENT DOCUMENTS

| | | |
|---|---|---|
| 6,511,439 B1 | 1/2003 | Tabata |
| 7,431,767 B2 | 10/2008 | Raaijmakers |

(Continued)

FOREIGN PATENT DOCUMENTS

| | | | | |
|---|---|---|---|---|
| WO | WO2020264571 | * | 12/2020 | ............ G03F 7/20 |

OTHER PUBLICATIONS

H. R. Philipp and E.A. Taft, "An optical characterization of native oxides and thin thermal oxides on silicon", J. Appl. Phys. vol. 53, pp. 5224-5229. (Year: 1982).*

(Continued)

*Primary Examiner* — Jiong-Ping Lu
(74) *Attorney, Agent, or Firm* — Banner & Witcoff, Ltd.

(57) ABSTRACT

A method of processing a silicon surface includes using a first radical species to remove contamination from the surface and to roughen the surface; and using a second radical species to smooth the roughened surface. Reaction systems for performing such a method, and silicon surfaces prepared using such a method, also are provided.

33 Claims, 4 Drawing Sheets

Figure 1A:
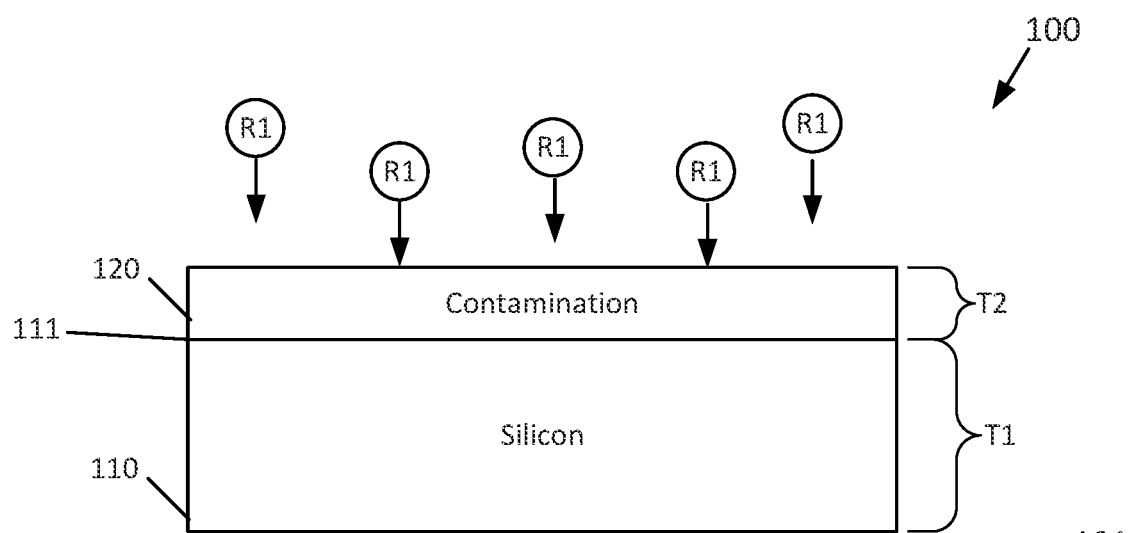

(51) Int. Cl.
 H01L 21/3065 (2006.01)
 H01L 21/67 (2006.01)

(56) References Cited

U.S. PATENT DOCUMENTS

| | | |
|---|---|---|
| 7,569,487 B2 | 8/2009 | Mieno |
| 7,629,270 B2 | 12/2009 | Swerts |
| 10,388,515 B2 | 8/2019 | Kao |
| 2007/0042130 A1 | 2/2007 | Ghanayem |
| 2018/0158689 A1* | 6/2018 | Mumford ............ H01L 21/3065 |
| 2018/0337040 A1 | 11/2018 | Kao |
| 2019/0019670 A1* | 1/2019 | Lin ........................... B08B 5/00 |
| 2019/0218103 A1 | 7/2019 | Hwang |
| 2020/0000606 A1 | 1/2020 | Grotz |
| 2020/0187133 A1 | 6/2020 | Syed |

OTHER PUBLICATIONS

H.R. Philipp and E.A. Taft, "An optical characterization of native oxide and thin thermal oxides on silicon", J. Appl. Phys. vol. 53(7), pp. 5224-5229. (Year: 1982).*

* cited by examiner

SYSTEMS AND METHODS FOR PROCESSING A SILICON SURFACE USING MULTIPLE RADICAL SPECIES

FIELD OF INVENTION

The present disclosure relates generally to processing a silicon surface using a radical species.

BACKGROUND OF THE DISCLOSURE

It is desirable to remove contamination from a silicon surface before depositing a film on that surface. For example, if a silicon film is to be epitaxially grown on that surface, the presence of contamination such as interfacial oxide (IFO) and/or interfacial carbon (IFC) on the silicon surface may perturb the crystal quality of the epitaxially grown film. A radical species such as chlorine, fluorine, or hydrogen has been used to remove or reduce IFO and/or IFC. However, it would be desirable to further improve the silicon surface's quality, for example so as to improve the quality of film(s) that are subsequently deposited onto that surface.

SUMMARY OF THE DISCLOSURE

This summary is provided to introduce a selection of concepts in a simplified form. These concepts are described in further detail in the detailed description of example embodiments of the disclosure below. This summary is not intended to identify key features or essential features of the claimed subject matter, nor is it intended to be used to limit the scope of the claimed subject matter.

Some examples herein provide a method of processing a silicon surface. The method may include using a first radical species to remove contamination from the surface and to roughen the surface. The method may include using a second radical species to smooth the roughened surface.

In some examples, the first radical species roughens the surface isotropically.

In some examples, the first radical species forms exposed silicon planes at the surface. In some examples, the second radical species preferentially reacts with the exposed silicon planes to smooth the roughened surface. In some examples, the exposed silicon planes include Si(100), Si(110), or Si(111).

In some examples, the smoothed surface includes Si(100), Si(110), or Si(111) and has an orientation that is different than any exposed silicon planes which are removed using the second radical species.

In some examples, the silicon is located within the same chamber during use of the first radical species and during use of the second radical species.

In some examples, the first radical species includes a fluorine, chlorine, or hydrogen radical. Some examples further include generating the fluorine radical using at least one precursor selected from the group consisting of: nitrogen trifluoride ($NF_3$); sulfur hexafluoride ($SF_6$); carbon tetrafluoride ($CF_4$); fluoroform ($CHF_3$); octafluorocyclobutane ($C_4F_8$); chlorine trifluoride ($ClF_3$); and fluorine ($F_2$).

In some examples, the second radical species includes a chlorine or small molecule radical. Some examples further include generating the chlorine radical using ($Cl_2$).

In some examples, the contamination includes interfacial oxide or interfacial carbon. In some examples, the first radical species forms covalent bonds with the interfacial oxide or interfacial carbon and with the silicon surface. In some examples, the first radical species removes substantially all of the interfacial oxide or interfacial carbon.

In some examples, the second radical species forms covalent bonds with the silicon surface.

In some examples, the smoothed surface consists primarily of silicon having substantially a single crystallographic orientation.

Some examples herein provide a system for processing a silicon surface. The system may include a reaction chamber configured to hold a substrate having a surface to be processed. The system may include a remote plasma unit. The system may include a first radical precursor source unit configured to provide a first radical species precursor to the remote plasma unit. The system may include a second radical precursor source unit configured to provide a second radical species precursor to the remote plasma unit. The system may include a controller. The controller may be configured to cause the remote plasma unit to generate a first radical species using the first radical species precursor. The controller may be configured to cause the first radical species to flow into the reaction chamber to remove contamination from the surface and roughen the surface. The controller may be configured to cause the remote plasma unit to generate a second radical species using the second radical species precursor. The controller may be configured to cause the second radical species to flow into the reaction chamber to smooth the roughened surface.

In some examples, the first radical species roughens the surface isotropically. In some examples, the first radical species forms exposed silicon planes at the surface. In some examples, the second radical species preferentially reacts with the exposed silicon planes to smooth the roughened surface. In some examples, the exposed silicon planes include Si(100), Si(110), or Si(111).

In some examples, the smoothed surface includes Si(100), Si(110), or Si(111) and has an orientation that is different than any exposed silicon planes which are removed using the second radical species.

In some examples, the silicon is located within the reaction chamber during use of the first radical species and during use of the second radical species.

In some examples, the first radical species includes a fluorine, chlorine, or hydrogen radical.

In some examples, the first radical species precursor is selected from the group consisting of: nitrogen trifluoride ($NF_3$); sulfur hexafluoride ($SF_6$); carbon tetrafluoride ($CF_4$); fluoroform ($CHF_3$); octafluorocyclobutane ($C_4F_8$); chlorine trifluoride ($ClF_3$); and fluorine ($F_2$).

In some examples, the second radical species includes a chlorine or small molecule radical.

In some examples, the second radical species precursor is chlorine ($Cl_2$).

In some examples, the contamination includes interfacial oxide or interfacial carbon. In some examples, the first radical species forms covalent bonds with the interfacial oxide or interfacial carbon and with the silicon surface. In some examples, the first radical species removes substantially all of the interfacial oxide or interfacial carbon.

In some examples, the second radical species forms covalent bonds with the silicon surface.

In some examples, the smoothed surface consists primarily of silicon having substantially a single crystallographic orientation.

Some examples herein provide a silicon surface processed using operations including using a first radical species to remove contamination from the surface and to roughen the surface; and using a second radical species to smooth the roughened surface.

For purposes of summarizing the invention and the advantages achieved over the prior art, certain objects and advantages of the invention have been described herein above. Of course, it is to be understood that not necessarily all such objects or advantages may be achieved in accordance with any particular embodiment of the invention. Thus, for example, those skilled in the art will recognize that the invention may be embodied or carried out in a manner that achieves or optimizes one advantage or group of advantages as taught or suggested herein without necessarily achieving other objects or advantages as may be taught or suggested herein.

All of these embodiments are intended to be within the scope of the invention herein disclosed. These and other embodiments will become readily apparent to those skilled in the art from the following detailed description of certain embodiments having reference to the attached figures, the invention not being limited to any particular embodiment(s) disclosed.

BRIEF DESCRIPTION OF THE DRAWING FIGURES

While the specification concludes with claims particularly pointing out and distinctly claiming what are regarded as embodiments of the invention, the advantages of embodiments of the disclosure may be more readily ascertained from the description of certain examples of the embodiments of the disclosure when read in conjunction with the accompanying drawings, in which:

FIGS. 1A-1D schematically illustrate cross-sections of example structures and operations during a method for processing a silicon surface using multiple radical species.

Figure 2:
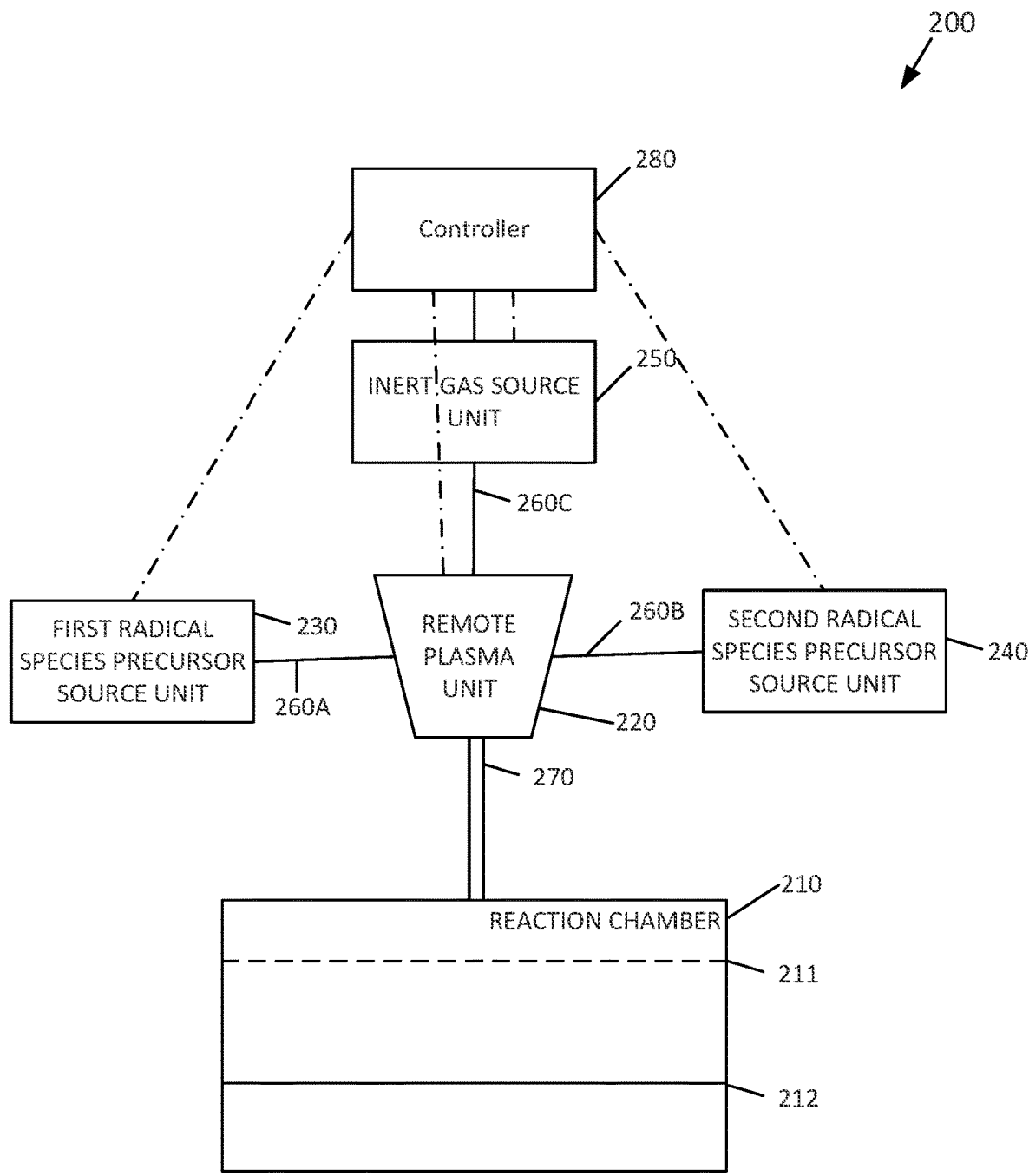

FIG. 2 schematically illustrates components of an example system for processing a silicon surface using multiple radical species.

Figure 3:
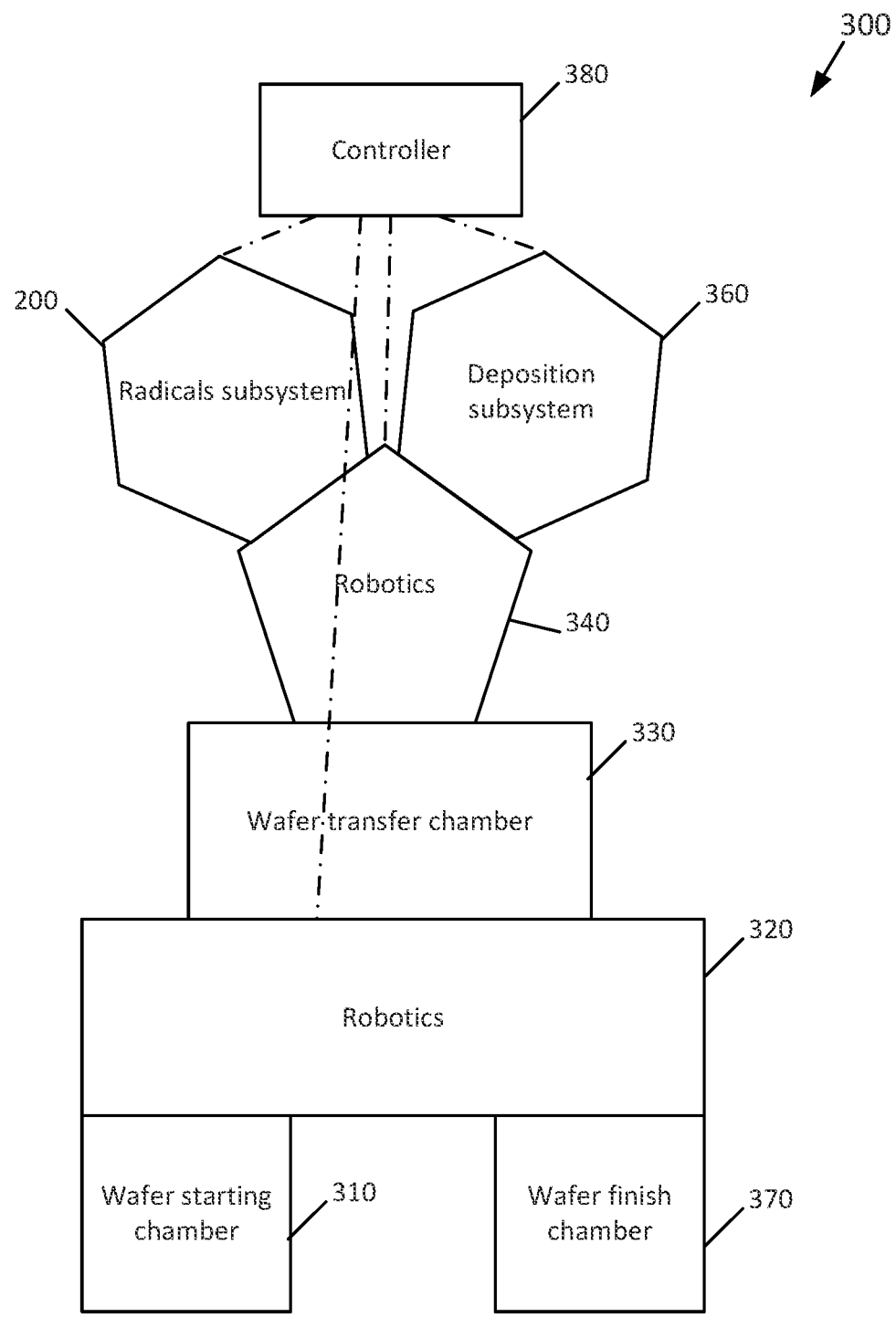

FIG. 3 schematically illustrates components of an example system for processing a silicon surface using multiple radical species, followed by depositing a film on that surface.

Figure 4:
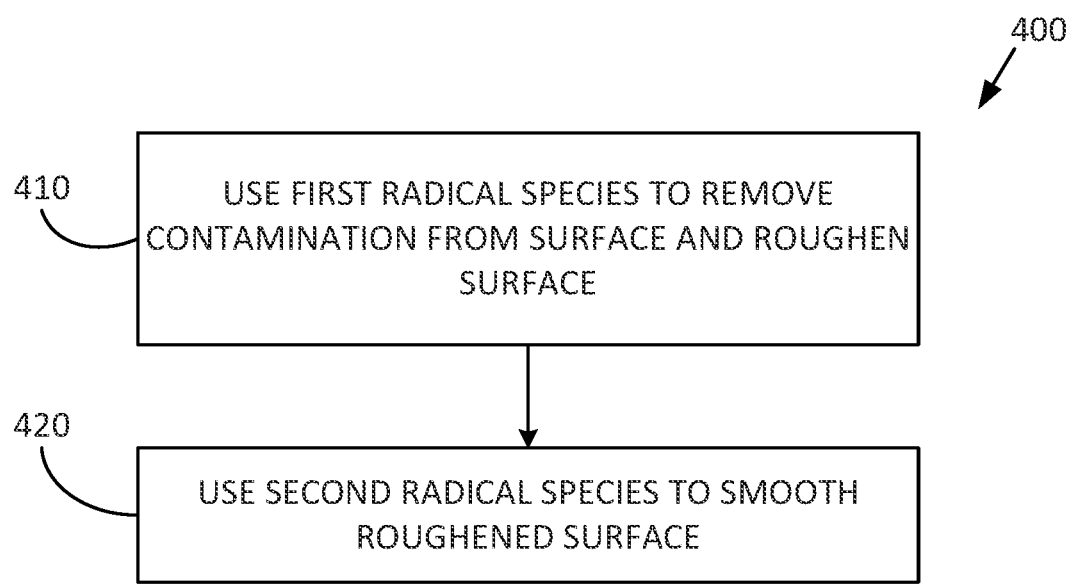

FIG. 4 illustrates a flow of operations in an example method for processing a silicon surface using multiple radical species.

The illustrations presented herein are not meant to be actual views of any particular material, structure, or device, but are merely idealized representations that are used to describe embodiments of the disclosure.

DETAILED DESCRIPTION OF EXEMPLARY EMBODIMENTS

Although certain embodiments and examples are disclosed below, it will be understood by those in the art that the invention extends beyond the specifically disclosed embodiments and/or uses of the invention and obvious modifications and equivalents thereof. Thus, it is intended that the scope of the invention disclosed should not be limited by the particular disclosed embodiments described below.

A number of example materials are given throughout the embodiments of the current disclosure, it should be noted that the chemical formulas given for each of the materials should not be construed as limiting and that the non-limiting example materials given should not be limited by a given example stoichiometry.

The terms "substantially," "approximately," and "about" used throughout this specification are used to describe and account for small fluctuations, such as due to variations in processing. For example, they may refer to less than or equal to ±10%, such as less than or equal to ±5%, such as less than or equal to ±2%, such as less than or equal to ±1%, such as less than or equal to ±0.5%, such as less than or equal to ±0.2%, such as less than or equal to ±0.1%, such as less than or equal to ±0.05%.

The term "silicon film" is intended to encompass films that include silicon, and that optionally may include one or more components other than silicon. For example, a "silicon film" may include silicon as well as a dopant, and optionally may consist essentially of the silicon and the dopant. Dopants may include Group III elements and/or Group V elements. Nonlimiting examples of dopants include phosphorous (P) and arsenic (As).

During previously known processes for using a radical species to remove contamination from silicon, the radical species covalently reacts with the contamination to form gas-phase molecular species. While such an operation has previously been thought of as generating a pristine or low-contaminant silicon surface, the present inventors have recognized that such an operation may undesirably roughen the silicon surface, and that such roughness may reduce the quality of film(s) subsequently deposited thereon. For example, the radical species includes a single valence electron that reacts quickly and isotropically with the contamination and/or with the silicon surface, and formation of the gas-phase molecular species may weaken bonds between adjacent silicon atoms at the surface. As such, if the silicon surface includes both (110) and (111) facets, the radical species' residency time on the surface is so short that any available silicon atom is available for reaction, not just higher energy sites. Reaction of the radical species with lower-energy sites may generate higher-energy sites, thus roughening the surface of the silicon.

As provided herein, a silicon surface may be processed using a first radical species that reduces contamination, and then using a second, different radical species that reduces any surface roughness caused by the first radical species. The first radical species may be more reactive than the second radical species. For example, the second radical species may be less labile than the first radical species and/or be generated using a diatomic species such as chlorine gas $Cl_2(g)$, hydrogen gas $H_2(g)$, or hydrofluoric acid gas HF (g). As such, the first radical species may effectively react with and remove contamination from the silicon surface, while the second radical species may repair damage that the first radical species causes to the silicon surface. Accordingly, the first and second radical species together may generate a smoother, lower energy surface upon which film(s) subsequently may be deposited with higher quality than provided by use of only a single radical species to remove contamination.

FIGS. 1A-1D schematically illustrate cross-sections of example structures and operations during a method for processing a silicon surface using multiple radical species. At operation 100 illustrated in FIG. 1A, a structure including silicon 110 and contamination 120 disposed on surface 111 of silicon 110 is exposed to a first radical species R1. Silicon 110 may have a thickness T1, and contamination 120 may have a thickness T2. In some examples, T1 may be in the range of about 5 nm to about 200 nm depending on the technology node and application. T2 may vary, e.g., depending on any upstream processing. For example, surface 111 may be treated with an HF dip before the present processing. In some examples, T2 may be in the range of about 1 nm to about 6 nm.

First radical species R1 removes contamination 120 from the surface 111 of silicon 110 and roughens the surface of the silicon. The first radical species R1 may react indiscriminately and isotropically both with contamination 120 and silicon 110. Because contamination 120 forms the uppermost layer of the assembly, the first radical species may remove some or substantially all of the contamination from surface 110. However, the first radical species R1 also may roughen surface 111 isotropically, e.g., may react non-preferentially with sites on surface 111 substantially independently of the relative energies of such sites. For example, the contamination may include IFO, IFC, or a combination of IFO and IFC. The first radical species R1 may form covalent bonds with the IFO, IFC, and/or with the silicon surface. At least some of the products of such reactions may be gaseous, although some of the products of such reactions may remain coupled to surface 111.

Figure 1B:
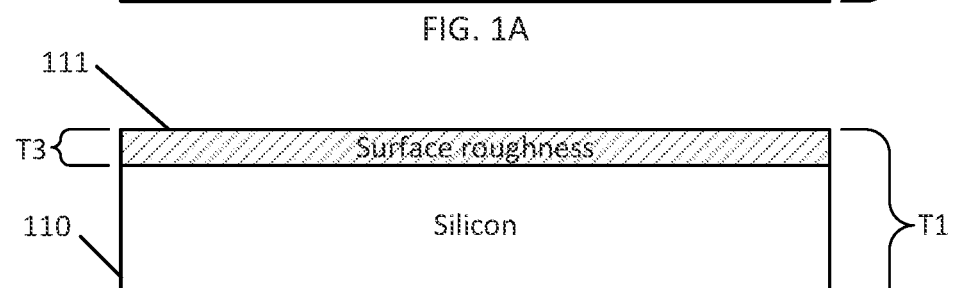

At operation 101 illustrated in FIG. 1B, the first radical species R1 and any gaseous reaction products then are removed, for example using a flow of an inert gas. As illustrated in FIG. 1B, following use of first radical species R1, silicon 110 may have substantially the same thickness T1 as prior to use of the first radical species, such that the surface 111 of silicon 110 is substantially at the same location as prior to use of the first radical species. However, the surface 111 may be roughened as a result of reaction with first radical species R1, and the roughness may have a thickness T3 extending into silicon 110. In some examples, thickness T3 of the roughness (e.g., the root mean square roughness as measured by atomic force microscopy) is on the scale of several atomic layers, e.g., about 1 Angstrom to about 10 Angstroms. Surface 111 also may include non-gaseous products of the reaction with first radical species R1.

Figure 1C:
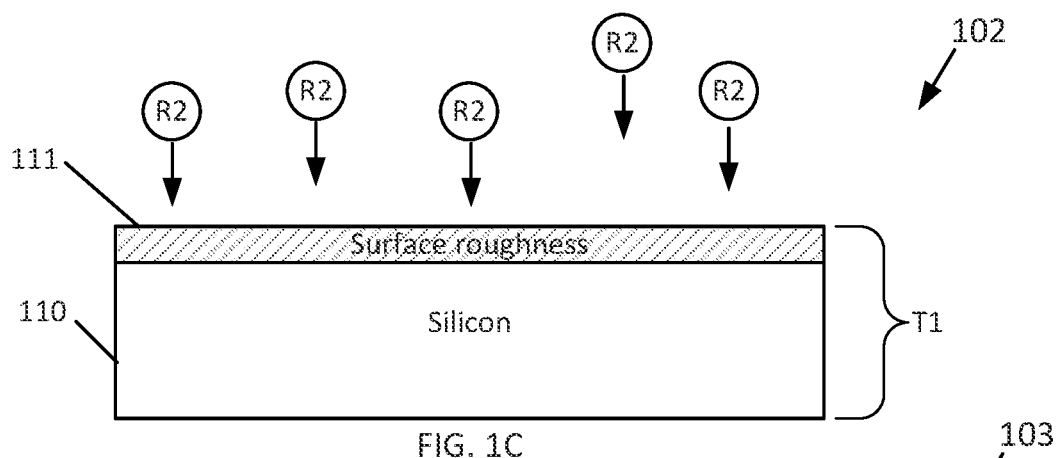

At operation 102 illustrated in FIG. 1C, the structure including silicon 110 with surface roughness is exposed to a second radical species R2 which smooths the roughened surface. Second radical species R2 also may react with any non-gaseous products of the reaction with first radical species R1. In some examples, one or more products of the reaction with second radical species R2 may be gaseous. Additionally, or alternatively, one or more products of the reaction with second radical species R2 may form surface terminations at the silicon surface. More specifically, depending on the particular second radical species R2 used, that species may terminate the silicon surface with Si-halide (e.g., Si—Cl or Si—F) and/or Si—H moieties. The present inventors have recognized that such surface terminations may inhibit oxide regrowth. For example, if the silicon is transferred from radicals subsystem 200 to deposition subsystem 360 in a manner such as described with reference to FIG. 3, the silicon surface may be exposed to moisture. The Si-halide (e.g., Si—Cl or Si—F) and/or Si—H moieties terminating the silicon surface may inhibit chemisorption of water and thus may inhibit such water from reacting to form oxide at the silicon surface.

Figure 1D:
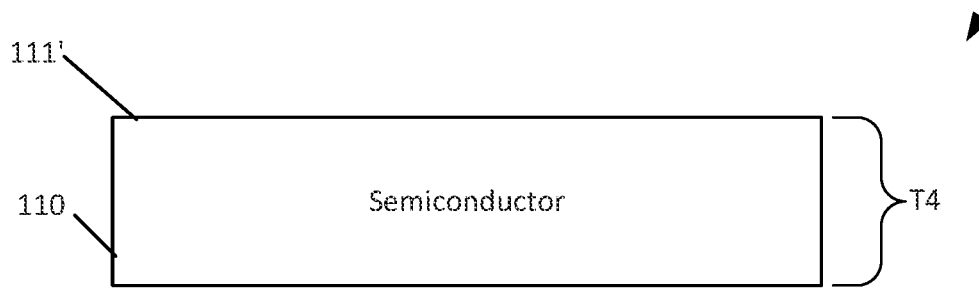

At operation 103 illustrated in FIG. 1D, the second radical species then is removed, for example using a flow of an inert gas. As illustrated in FIG. 1D, following use of second radical species R2, the surface roughness of silicon 110 is substantially removed. Smoothing the roughened surface removes a portion of silicon 110, such that the surface 111' is lower than surface 111 had been, and silicon 110 has a reduced thickness T4 which is less than T1.

In some examples, first radical species R1 forms exposed silicon planes at surface 111. For example, first radical species R1 may remove portions of silicon 110 from surface 111 by reacting with such portions during operation 100. Depending on the composition and crystal orientation of silicon 110, such reactions may expose silicon planes which form at least part of the surface roughness. During operation 102, the second radical species may form covalent bonds with the silicon surface. For example, the second radical species R2 preferentially may react with the exposed silicon planes, because such exposed planes may be of higher energy than the remainder of silicon 110 and/or may have a greater surface area than the remainder of silicon 110. Accordingly, smoothed surface 111' may consist primarily of (and in some examples may consist essentially of) a single crystallographic orientation (the same crystallographic orientation as silicon 110) and may be substantially devoid of any contamination 120, e.g., any IFC and/or IFO. In examples in which silicon 110 consists primarily (e.g., essentially) of silicon having a single crystallographic orientation, the smoothed surface 111' may consist primarily (e.g., essentially) of silicon having substantially the same single crystallographic orientation. As a result of the smoothing process provided by treatment with second radical species R2 following treatment with first radical species R1, the number of defect sites, such as the number of step edges formed by non-favorable crystal planes, may be reduced. For example, depending on the application, the silicon primarily or essentially may consist of Si(100), Si(110), or Si(111), and surface roughness may include deviations from such respective crystal orientations. Illustratively, silicon 110 includes or may consist essentially of Si(100), the defect sites may include Si(110) and/or Si(111) in the form of step edges, and the smoothed surface may consist primarily (e.g., essentially) of Si(100), substantially devoid of contamination 120. In another example, silicon 110 includes or may consist essentially of Si(110), the defect sites may include Si(100) and/or Si(111) in the form of step edges, and the smoothed surface may consist primarily (e.g., essentially) of Si(110), substantially devoid of contamination 120. In another example, silicon 110 includes or may consist essentially of Si(111), the defect sites may include Si(100) and/or Si(110) in the form of step edges, and the smoothed surface may consist primarily (e.g., essentially) of Si(111), substantially devoid of contamination 120.

Any suitable first radical species R1 may be used that substantially removes contamination 120 and roughens surface 111 of silicon 110, and the first radical species may be generated in any suitable manner. In nonlimiting examples such as described with reference to FIG. 2, the first radical species R1 may be generated using a first radical precursor and a remote plasma unit that generates the first radical species using the first radical precursor. In some examples, first radical species R1 includes a fluorine, hydrogen, or chlorine radical. The fluorine radical may be generated using at least one precursor selected from the group consisting of: nitrogen trifluoride ($NF_3$); sulfur hexafluoride ($SF_6$); carbon tetrafluoride ($CF_4$); fluoroform ($CHF_3$); octafluorocyclobutane ($C_4F_8$); chlorine trifluoride ($ClF_3$); and fluorine ($F_2$).

Any suitable second radical species R2 may be used that smooths the roughened surface of silicon 110, and the second radical species may be generated in any suitable manner. In nonlimiting examples such as described with reference to FIG. 2, the second radical species R2 may be generated using a second radical precursor and a remote plasma unit that generates the second radical species using the second radical precursor. In some examples, second radical species R2 includes a chlorine radical or small molecule radical such as HF or $H_2$. The chlorine radical may be generated using chlorine ($Cl_2$). The small molecule radical may arrive to the surface as-is.

It will be appreciated that any suitable system(s) may be used to process the surface of silicon 110 using the first radical species R1 and the second radical species R2. In some examples, silicon 110 may be located within the same chamber during use of the first radical species R1 and during use of the second radical species R2. That is, silicon 110 need not necessarily be located in one chamber during use of first radical species R1 and moved to another chamber for use of second radical species R2. Instead, operations 100, 101, 102, and 103 described with reference to FIGS. 1A-1D all may be performed in the same chamber as one another, thus providing a streamlined flow of operations for processing the silicon surface.

For example, FIG. 2 schematically illustrates components of an example system for processing the surface of a silicon using multiple radical species. System 200 illustrated in FIG. 2 may include reaction chamber 210; remote plasma unit 220; first radical species precursor source unit 230; second radical species precursor source unit 240; inert gas source unit 250; a series of gas lines 260A-260C respectively coupling the first radical species precursor source unit, second radical species precursor source unit, and inert gas source unit to remote plasma unit 220; a main gas line 270 coupling remote plasma unit 220 to reaction chamber 210; and controller 280.

Controller 280 may be operably coupled to the first radical species precursor source unit 230, the second radical species precursor source unit 240, the inert gas source unit 250, and the remote plasma unit 220 (such electrical connections being illustrated in dash-dot lines). Controller 280 may be configured to control so as to implement operations 100, 101, 102, and 103 described with reference to FIGS. 1A-1D. For example, controller 280 may be configured to as to cause first radical species precursor source unit 230 to flow the first radical species precursor through gas line 260A and to cause the inert gas source unit to flow the inert gas through gas line 260C into remote plasma unit 220. Controller 280 also may be configured so as to cause the remote plasma unit 220 to ignite the resulting mixture of gases to form a plasma including first radical species R1, and to flow the first radical species through main gas line 270 to reaction chamber 210 so as to implement operation 100 described with reference to FIG. 1A. Controller 280 further may be configured to cause the inert gas source unit to flow the inert gas into remote plasma unit 220, and to cause the remote plasma unit 220 to flow the inert gas through main gas line 270, without igniting a plasma, to reaction chamber 210 so as to implement operation 101 described with reference to FIG. 1B after operation 100 is complete.

Controller 280 further may be configured to as to cause second radical species precursor source unit 240 to flow the second radical species precursor through gas line 260B and to cause the inert gas source unit to flow the inert gas through gas line 260C into remote plasma unit 220. Controller 280 also may be configured so as to cause the remote plasma unit 220 to ignite the resulting mixture of gases to form a plasma including second radical species R2, and to flow the second radical species through main gas line 270 to reaction chamber 210 so as to implement operation 102 described with reference to FIG. 1C after operation 101 is complete. Controller 280 further may be configured to cause the inert gas source unit to flow the inert gas into remote plasma unit 220, and to cause the remote plasma unit 220 to flow the inert gas through main gas line 270, without igniting a plasma, to reaction chamber 210 so as to implement operation 103 described with reference to FIG. 1D after operation 102 is complete.

Reaction chamber 210 may include stage 212 configured to hold silicon 210, and flow regulator 211 configured to provide for relatively even flow of gases to the surface of the silicon during operations 100-103.

It will be understood that components of system 200 described with reference to FIG. 2 optionally may be incorporated into larger systems that are configured to perform one or more additional operations using the silicon surface provided herein. For example, FIG. 3 schematically illustrates components of an example system for processing the surface of a silicon using multiple radical species, followed by depositing a film on that surface. System 300 includes radicals subsystem 200 which may correspond to system 200 described with reference to FIG. 2, and controller 380 which may correspond to controller 280 described with reference to FIG. 2 but with additional functionality so as to control additional subsystems. For example, system 300 may include wafer starting chamber 310; robotics 320; wafer transfer chamber 330; robotics 340; deposition subsystem 360; and wafer finish chamber 370. Controller 380 may be operably coupled to radicals subsystem 200, robotics 320, robotics 340, and deposition subsystem 360 (such electrical connections being illustrated in dash-dot lines).

Wafer starting chamber 310 may be configured to receive any suitable number of silicon wafers for processing. Controller 380 may be configured to cause robotics 320 to move wafer(s) from wafer starting chamber 310 to wafer transfer chamber 330. Controller 380 also may be configured to cause robotics 340 to move wafer(s) from wafer transfer chamber 330 to radicals subsystem 200 for processing such as described with reference to FIGS. 1A-1D and 2. Controller 380 also may be configured to cause robotics 340 to move wafer(s) from radicals subsystem 200 to deposition subsystem 360 for deposition of at least one film on the processed silicon. In one nonlimiting example, deposition subsystem 360 is configured to epitaxially grow a silicon film on the processed silicon. Controller 380 also may be configured to cause robotics 340 to move wafer(s) from deposition subsystem 360 to wafer transfer chamber 330. Controller 380 also may be configured to cause robotics 320 to move wafer(s) from wafer transfer chamber 330 to wafer finish chamber 370.

It will be appreciated that systems 200 and 300 provide nonlimiting examples of hardware and software that may be used to process silicon in the manner provided herein. For example, FIG. 4 illustrates a flow of operations in an example method for processing the surface of a silicon using multiple radical species. Method 400 illustrated in FIG. 4 may include using a first radical species to remove contamination from the surface and to roughen the surface (operation 410), e.g., in a manner such as described with reference to operation 100 of FIG. 1A. Method 400 also may include using a second radical species to smooth the roughened surface (operation 420), e.g., in a manner such as described with reference to operation 102 of FIG. 1C. Other suitable operations may be performed between operations 410 and 420, and other suitable operations may be performed after operation 420, such as deposition of a film on the processed surface. As provided herein, the present use of multiple radical species provides for silicon surfaces that are of higher quality than may be obtained using just a single radical species, and as such the film(s) subsequently deposited on such surfaces also may be of higher quality.

Silicon 110, which may be used in operations 100-103 or 410-420 and in systems 200 or 300, may include any suitable combination of materials. For example, silicon 110 may consist essentially of a silicon wafer. Or, for example, silicon 110 may include a film that is disposed on a silicon wafer. Silicon 110 and/or any other films that may be disposed on the silicon wafer may be patterned. For example, silicon 110 may include a component of a FINFET or a storage node capacitor for DRAM. Note that any such patterning may have significantly larger feature sizes than those of any silicon planes that are exposed using the first radical species R1 as described with reference to FIGS. 1A-1B. Such patterning may have significantly lower energy than such exposed silicon planes. As such, the second radical species R2 may react preferentially with the higher-energy silicon planes as compared to any such patterning.

It will be appreciated that controller 280 may be implemented using any suitable combination of digital electronic circuitry, integrated circuitry, application specific integrated circuits (ASICs), field programmable gate arrays (FPGAs), central processing units (CPUs), graphical processing units (GPUs), computer hardware, firmware, software, and/or combinations thereof. For example, one or more functionalities of controller 280 may be implemented in one or more computer programs that are executable and/or interpretable on a programmable system including at least one programmable processor, which can be special or general purpose, coupled to receive data and instructions from, and to transmit data and instructions to, a storage system, at least one input device, and at least one output device. The programmable system or computing system can include clients and servers. A client and server are generally remote from each other and typically interact through a communication network. The relationship of client and server arises by virtue of computer programs running on the respective computers and having a client-server relationship to each other.

These computer programs, which can also be referred to as modules, programs, software, software applications, applications, components, or code, can include machine instructions for a programmable processor, and/or can be implemented in a high-level procedural language, an object-oriented programming language, a functional programming language, a logical programming language, and/or in assembly/machine language. As used herein, the terms "memory" and "computer-readable medium" refer to any computer program product, apparatus and/or device, such as magnetic discs, optical disks, solid-state storage devices, memory, and Programmable Logic Devices (PLDs), used to provide machine instructions and/or data to a programmable data processor, including a machine-readable medium that receives machine instructions as a computer-readable signal. The term "computer-readable signal" refers to any signal used to provide machine instructions and/or data to a programmable data processor. The computer-readable medium can store such machine instructions non-transitorily, such as would a non-transient solid-state memory or a magnetic hard drive or any equivalent storage medium. The computer-readable medium can alternatively or additionally store such machine instructions in a transient manner, such as for example as would a processor cache or other random access memory associated with one or more physical processor cores.

The computer components, software modules, functions, data stores and data structures can be connected directly or indirectly to each other in order to allow the flow of data needed for their operations. It is also noted that a module or processor includes but is not limited to a unit of code that performs a software operation, and can be implemented for example as a subroutine unit of code, or as a software function unit of code, or as an object (as in an object-oriented paradigm), or as an applet, or in a computer script language, or as another type of computer code. The software components and/or functionality can be located on a single computer or distributed across multiple computers and/or the cloud, depending upon the situation at hand.

In one nonlimiting example, controller 280 described with reference to FIGS. 2-3 may be implemented using a computing device architecture. In such architecture, a bus (not specifically illustrated) can serve as the information highway interconnecting the other illustrated components of the hardware. The system bus can also include at least one communication port (such as a network interface) to allow for communication with external devices either physically connected to the computing system or available externally through a wired or wireless network. Controller 280 may be implemented using a CPU (central processing unit) (e.g., one or more computer processors/data processors at a given computer or at multiple computers) that can perform calculations and logic operations required to execute a program. Controller 280 may include a non-transitory processor-readable storage medium, such as read only memory (ROM) and/or random access memory (RAM) in communication with the processor(s) and can include one or more programming instructions for the operations provided herein, e.g., for implementing methods 300 and/or 400. Optionally, the memory may include a magnetic disk, optical disk, recordable memory device, flash memory, or other physical storage medium. To provide for interaction with a user, controller 280 may include or may be implemented on a computing device having a display device (e.g., a CRT (cathode ray tube) or LCD (liquid crystal display) monitor) for displaying information obtained to the user and an input device such as keyboard and/or a pointing device (e.g., a mouse or a trackball) and/or a touchscreen by which the user can provide input to the computer.

The example embodiments of the disclosure described above do not limit the scope of the invention, since these embodiments are merely examples of the embodiments of the invention, which is defined by the appended claims and their legal equivalents. Any equivalent embodiments are intended to be within the scope of this invention. Indeed, various modifications of the disclosure, in addition to those shown and described herein, such as alternative useful combination of the elements described, may become apparent to those skilled in the art from the description. Such modifications and embodiments are also intended to fall within the scope of the appended claims.

What is claimed is:

1. A method of processing a surface of silicon, the method comprising:
   removing contamination from the surface and roughening the surface, by exposing the surface to a first radical species;
   smoothing the roughened surface, by exposing the surface to a second radical species; and
   epitaxially growing a silicon film on the smoothed surface.

2. The method of claim 1, wherein roughening the surface comprises roughening the surface isotropically.

3. The method of claim 1, wherein roughening the surface comprises exposing a plurality of silicon planes at the surface.

4. The method of claim 3, wherein smoothing the roughened surface comprises causing the second radical species to preferentially react with the exposed silicon planes.

5. The method of claim 3, wherein the exposed silicon planes comprise at least one of: Si(100), Si(110), or Si(111).

6. The method of claim 1, wherein the smoothed surface comprises Si(100), Si(110), or Si(111) and has an orientation that is different than any exposed silicon planes which are removed using the second radical species.

7. The method of claim 1, wherein the silicon is located within the same chamber during use of the first radical species and during use of the second radical species.

8. The method of claim 1, wherein the first radical species comprises a fluorine radical, a chlorine radical, or a hydrogen radical.

9. The method of claim 1, wherein the first radical species comprises a fluorine radical, the method further comprising generating the fluorine radical using at least one precursor selected from the group consisting of: nitrogen trifluoride ($NF_3$); sulfur hexafluoride ($SF_6$); carbon tetrafluoride ($CF_4$); fluoroform ($CHF_3$); octafluorocyclobutane ($C_4F_8$); chlorine trifluoride ($ClF_3$); and fluorine ($F_2$).

10. The method of claim 1, wherein the second radical species comprises a chlorine radical or a small molecule radical.

11. The method of claim 1, wherein the second radical species comprises a chlorine radical, the method further comprising generating the chlorine radical using $Cl_2$.

12. The method of claim 1, wherein the contamination comprises interfacial oxide or interfacial carbon.

13. The method of claim 12, wherein using the first radical species comprises causing the first radical species to form covalent bonds between the surface and the interfacial oxide or the interfacial carbon.

14. The method of claim 12, wherein removing the contamination from the surface comprises removing substantially all of the interfacial oxide or the interfacial carbon.

15. The method of claim 1, wherein using the second radical species comprises causing the second radical species to form covalent bonds with the surface.

16. The method of claim 1, wherein the smoothed surface consists primarily of silicon having substantially a single crystallographic orientation.

17. A system for processing a surface of silicon, the system comprising:
a reaction chamber configured to hold a substrate having a surface to be processed;
a remote plasma unit;
a first radical precursor source unit configured to provide a first radical species precursor to the remote plasma unit;
a second radical precursor source unit configured to provide a second radical species precursor to the remote plasma unit;
one or more processors; and
memory storing instructions that, when executed by the one or more processors, cause the system to:
cause the remote plasma unit to generate a first radical species using the first radical species precursor;
cause contamination to be removed from the surface and cause roughening of the surface, by causing the first radical species to flow into the reaction chamber;
cause the remote plasma unit to generate a second radical species using the second radical species precursor;
cause smoothing of the roughened surface by causing the second radical species to flow into the reaction chamber; and
cause epitaxial growth of a silicon film on the smoothed surface.

18. The system of claim 17, wherein the first radical species is configured to roughen the surface isotropically.

19. The system of claim 17, wherein the first radical species is configured to form exposed silicon planes at the surface.

20. The system of claim 19, wherein the second radical species is configured to preferentially react with the exposed silicon planes.

21. The system of claim 19, wherein the exposed silicon planes comprise at least one of: Si(100), Si(110), or Si(111).

22. The system of claim 17, wherein the smoothed surface comprises Si(100), Si(110), or Si(111) and has an orientation that is different than any exposed silicon planes which are removed using the second radical species.

23. The system of claim 17, wherein the instructions, when executed by the one or more processors, cause the system to cause the remote plasma unit to generate both the first radical species and the second radical species while the silicon is located within the reaction chamber.

24. The system of claim 17, wherein the first radical species comprises a fluorine radical, a chlorine radical, or a hydrogen radical.

25. The system of claim 17, wherein the first radical species precursor is selected from the group consisting of: nitrogen trifluoride ($NF_3$); sulfur hexafluoride ($SF_6$); carbon tetrafluoride ($CF_4$); fluoroform ($CHF_3$); octafluorocyclobutane ($C_4F_8$); chlorine trifluoride ($ClF_3$); and fluorine ($F_2$).

26. The system of claim 17, wherein the second radical species comprises a chlorine radical or a small molecule radical.

27. The system of claim 17, wherein the second radical species precursor is chlorine ($Cl_2$).

28. The system of claim 17, wherein the contamination comprises interfacial oxide or interfacial carbon.

29. The system of claim 28, wherein the first radical species is configured to form covalent bonds between the surface and the interfacial oxide or the interfacial carbon.

30. The system of claim 28, wherein the instructions, when executed by the one or more processors, cause the system to cause contamination to be removed by using the first radical species to remove substantially all of the interfacial oxide or interfacial carbon.

31. The system of claim 17, wherein the second radical species is configured to form covalent bonds with the surface.

32. The system of claim 17, wherein the smoothed surface consists primarily of silicon having substantially a single crystallographic orientation.

33. The system of claim 17, further comprising a deposition subsystem, wherein the instructions, when executed by the one or more processors, cause the epitaxial growth of the silicon on the surface to be performed using the deposition subsystem.

\* \* \* \* \*